US012518943B2

(12) United States Patent
Zhang et al.

(10) Patent No.: US 12,518,943 B2
(45) Date of Patent: Jan. 6, 2026

(54) ION SOURCE BAFFLE, ION ETCHING MACHINE, AND USAGE METHOD THEREFOR

(71) Applicant: JIANGSU LEUVEN INSTRUMENTS CO. LTD, Xuzhou (CN)

(72) Inventors: Yaoyao Zhang, Xuzhou (CN); Dongdong Hu, Xuzhou (CN); Haiyang Liu, Xuzhou (CN); Jun Zhang, Xuzhou (CN); Na Li, Xuzhou (CN); Shiran Cheng, Xuzhou (CN); Zhiyou Zhu, Xuzhou (CN); Kaidong Xu, Xuzhou (CN)

(73) Assignee: JIANGSU LEUVEN INSTRUMENTS CO. LTD, Xuzhou (CN)

( * ) Notice: Subject to any disclaimer, the term of this patent is extended or adjusted under 35 U.S.C. 154(b) by 488 days.

(21) Appl. No.: 17/999,463

(22) PCT Filed: May 19, 2021

(86) PCT No.: PCT/CN2021/094607

§ 371 (c)(1),
(2) Date: Nov. 21, 2022

(87) PCT Pub. No.: WO2021/233337

PCT Pub. Date: Nov. 25, 2021

(65) Prior Publication Data

US 2023/0207250 A1 Jun. 29, 2023

(30) Foreign Application Priority Data

May 22, 2020 (CN) ......................... 202010440876.3

(51) Int. Cl.

| | |
|---|---|
| ***H01J 37/08*** | (2006.01) |
| ***H01J 37/305*** | (2006.01) |
| ***H01J 37/32*** | (2006.01) |

(52) U.S. Cl.

CPC .......... *H01J 37/08* (2013.01); *H01J 37/3053* (2013.01); *H01J 37/32357* (2013.01); *H01J 37/32633* (2013.01); *H01J 2237/3341* (2013.01)

(58) Field of Classification Search

CPC .. H01J 37/08; H01J 37/3053; H01J 37/32357; H01J 37/32633;

(Continued)

(56) References Cited

U.S. PATENT DOCUMENTS

| | | | |
|---|---|---|---|
| 4,867,859 | A | 9/1989 | Harada et al. |
| 2002/0144785 | A1 | 10/2002 | Srivastava et al. |

(Continued)

FOREIGN PATENT DOCUMENTS

| | | | |
|---|---|---|---|
| CN | H06204181 | A | 7/1994 |
| CN | 2775832 | Y | 4/2006 |

(Continued)

OTHER PUBLICATIONS

English translation of Song (Year: 2015).*

(Continued)

*Primary Examiner* — David E Smith
*Assistant Examiner* — Laura Eloise Tandy
(74) *Attorney, Agent, or Firm* — HAUPTMAN HAM, LLP

(57) ABSTRACT

An ion source baffle includes a baffle body, wherein the baffle body is of a hollow structure; baffles are symmetrically fixedly arranged on an inner wall of the baffle body; the baffles extend towards the center of the baffle body; and in the direction from the inner wall of the baffle body towards the center of the baffle body, a shielding area formed by the baffles is reduced. The ion etching machine includes a discharge chamber, a reaction chamber and an ion source baffle, wherein the ion source baffle is clamped on an inner (Continued)

wall of the discharge chamber; and plasma sequentially passes through the ion source baffle and an ion source grid assembly. In the ion etching machine, the ion source baffle is additionally provided, such that after plasma is shielded by the ion source baffle.

4 Claims, 8 Drawing Sheets

(58) Field of Classification Search
CPC ......... H01J 2237/3341; H01J 37/32422; H01J 37/32431; H01J 37/32798; H01J 2237/334; Y02P 70/50; H01L 21/67069
See application file for complete search history.

(56) References Cited

U.S. PATENT DOCUMENTS

| | | | | |
|---|---|---|---|---|
| 2005/0148157 | A1 | 7/2005 | Kane et al. | |
| 2015/0214337 | A1* | 7/2015 | Ko | H01L 21/3083 438/694 |
| 2016/0064260 | A1 | 3/2016 | Berry, III et al. | |
| 2019/0371574 | A1* | 12/2019 | Hsieh | H01L 21/68785 |
| 2020/0388470 | A1* | 12/2020 | Pathak | H01J 37/3244 |

FOREIGN PATENT DOCUMENTS

| | | | | | |
|---|---|---|---|---|---|
| CN | 101490794 | A | | 7/2009 | |
| CN | 2014209406 | A | | 11/2014 | |
| CN | 104233229 | A | | 12/2014 | |
| CN | 104567485 | A | * | 4/2015 | |
| CN | 106683966 | A | * | 5/2017 | H01J 37/09 |
| CN | 108428611 | A | * | 8/2018 | H01J 37/32366 |
| CN | 108573891 | A | | 9/2018 | |
| CN | 109950121 | A | | 6/2019 | |
| CN | 110047724 | A | | 7/2019 | |
| CN | 110223903 | A | | 9/2019 | |
| CN | 110223904 | A | | 9/2019 | |
| CN | 110571121 | A | | 12/2019 | |
| CN | 111081525 | A | | 4/2020 | |
| JP | H08250055 | A | | 9/1996 | |
| KR | 101552667 | B1 | * | 9/2015 | |

OTHER PUBLICATIONS

English translation of Diao (Year: 2017).*
English translation of Lee (Year: 2015).*
English Translation of Yin (Year: 2018).*
International Search Report and Written Opinion issued in International Application No. PCT/CN2021/094607; mailed Aug. 20, 2021; 12 pgs.

* cited by examiner

ION SOURCE BAFFLE, ION ETCHING MACHINE, AND USAGE METHOD THEREFOR

RELATED APPLICATIONS

The present application is a U.S. National Phase of International Application Number PCT/CN2021/094607, filed May 19, 2021, and claims priority to Chinese Application Number 202010440876.3, filed May 22, 2020.

TECHNICAL FIELD

The present disclosure belongs to the field of machining equipment, and in particular to an ion source baffle, an ion etching machine and a usage method thereof.

BACKGROUND

The ion source is a key component for ion beam etching, and the quality of the ion source directly affects the etching performance. The specific process of ion beam etching is that: in a radio-frequency (RF) ion source, for example, the ionized gas of Ar and $O_2$ enters into a quartz discharge chamber through a specially-designed gas pressure equalizing insulator, and is excited through a high frequency wave initiated by an RF coil, so that electrons and positive ions in the plasma gas are mixed to form a plasma, and the plasma is transmitted to a target substrate in the form of an ion beam through a Grid assembly to etch the surface of the target substrate (wafer). The ion source Grid assembly is generally composed of a screen grid, an accelerating grid and a decelerating grid (some have no decelerating gird) and adopts a three-grid system, so that the ion source has better performance under a low-energy flow, the beam divergence angle is relatively smaller, and the pollution from the grid can be reduced. As an anode in the discharge chamber, the screen grid can absorb the discharge electrons to form a discharge loop and play a focusing effect. The accelerating grid can extract positive ions, and the decelerating grid can effectively adjust the ion distribution.

In the prior art, when the gas is ionized in the discharge chamber, the plasma density continuously decreases from the central region to the peripheral region in the radial direction. In order to ensure the etching uniformity of the target substrate, the size of the small holes on the screen grid is required to gradually increase from the central region to the peripheral region in the radial direction, so as to ensure the etching uniformity of the ion source. As illustrated in FIG. 1(*a*) to FIG. 1(*c*), r1 to r4 (coordinate X) are the distances from the regions where the small holes on the screen grid are located to the center of the screen gird, ϕ1 to ϕ4 (coordinate Y) are the diameters of small holes on the grid, the etching speed in the peripheral region is more rapid, which makes the overall etching of the target substrate uniform. As illustrated in FIG. 2(*a*) to FIG. 2(*b*), the etching speed in the peripheral region of the target substrate is most rapid.

SUMMARY

The objectives of the present disclosure is to provide a ion source baffle, a ion etching machine and a usage method thereof. In the ion etching machine, the ion source baffle is additionally provided, a plasma generated in the discharge chamber sequentially passes through the ion source baffle, a screen grid and an accelerating grid, such that after plasma is shielded by the ion source baffle, the quantity of the plasma gradually increases from a peripheral region of the discharge chamber to a central region of the discharge chamber, and the plasma density at the peripheral region of the discharge chamber decreases relative to the central region of the discharge chamber, which compensates for a structural design in which a screen grid has outer small holes larger than inner small holes, and ensures the uniformity of a plasma beam formed by the plasma passing through the screen grid. In order to achieve the above-mentioned objectives, the following technical solutions are adopted in the present disclosure.

Provided in the present disclosure is an ion source baffle. The ion source baffle comprises a baffle body, the baffle body is of a hollow structure. Baffles are symmetrically and fixedly arranged on an inner wall of the baffle body. The baffles extend towards a center of the baffle body. A shielding area formed by baffles is reduced in a direction from the inner wall of baffle body towards the center of the baffle body.

Preferably, the baffle body is of a ring shape.

Preferably, an inner segment of each of the baffles is of a polygon or a circle shape.

Preferably, each of the baffles is of a fan shape.

Preferably, a fan-shaped central angle corresponding to the fan-shaped baffle ranges from 3° to 15°.

Preferably, a material of each of the baffles is a quartz material or a ceramic material.

Further provided in the present disclosure is an ion etching machine based on the ion source baffle, the ion etching machine comprises a discharge chamber and a reaction chamber. The reaction chamber includes a connection cavity and a reaction cavity in communication with the connection cavity. The discharge chamber is located in the connection cavity and communicated with the reaction cavity. An ion source Grid assembly configured to focus a plasma to form a plasma beam is arranged in the connection cavity. The ion source Grid assembly is proximate to one side of discharge chamber in communication with the reaction cavity. The ion source Gird assembly includes a screen grid. The inner small holes and outer small holes are arranged on the screen grid. A diameter of each of the inner small hole is less than a diameter of each the outer small holes. The ion source baffle is clamped on an inner wall of the discharge chamber, and the plasma sequentially passes through the ion source baffles and the ion source Grid assembly.

Preferably, a distance between the ion source baffle and the ion source Grid assembly is greater than 3 mm.

Further provided in the present disclosure is a method for using the ion etching machine based on the ion etching machine. The method comprises the following steps.

(1) The ion source baffle is clamped on one side of the discharge chamber proximate to the ion source Grid assembly.

(2) The plasma is generated in the discharge chamber.

(3) After the plasma is shielded by the ion source baffle, a quantity of plasma is gradually increased from a peripheral region of the discharge chamber to a central area of the discharge chamber.

(4) The plasma is injected into a screen grid of the ion source Grid assembly, and then the plasma sequentially passes through the screen grid to form a plasma beam, and the plasma beam passes through an accelerating grid of a Grid assembly and is injected into the reaction cavity.

Compared with the prior art, the present disclosure has the following advantages.

(1) The shielding region formed by the baffles gradually decreases in the direction from the inner wall of the baffle body to the center of the baffle body, so that the plasma shielded by the peripheral region of the baffle body is more than the plasma shielded by the central region of the baffle body, and after the plasma is shielded by the baffles, under the action of the baffles, the quantity of the plasma gradually increases from the peripheral region of the discharge chamber to the central region of the discharge chamber, that is, compared with the central region of the discharge chamber, the plasma density in the peripheral region of the discharge chamber is reduced.

(2) The ion etching machine is additionally provided with an ion source baffle, and the plasma generated in the discharge chamber sequentially passes through the ion source baffle, the screen grid and the accelerating grid, such that after the plasma is shielded by the ion source baffle, the quantity of the plasma gradually increases from the peripheral region of the discharge chamber to the central region of the discharge chamber, and the plasma density at the peripheral region of the discharge chamber decreases relative to the central area of the discharge chamber, thereby compensating for a structural design in which the screen grid has outer small holes larger than inner small holes; after the plasma passes through the screen grid and the accelerating grid, a plasma beam tends to be uniformly distributed is formed, which ensures the uniformity of a plasma beam formed by the plasma passing through the ion source Gird assembly.

BRIEF DESCRIPTION OF THE DRAWINGS

FIG. 1(*b*) illustrates a partial schematic view of small holes on a screen grid in FIG. 1(*a*).

FIG. 1(*c*) illustrates a schematic diagram of a diameter change of inner smalls hole and outer small holes on the screen gird of FIG. 1(*a*).

FIG. 3(*b*) to FIG. 3(*e*) illustrate structural diagrams of the ion source baffle in other Embodiments of the present disclosure.

FIG. 4(*b*) illustrates a partial schematic view of FIG. 4(*a*).

FIG. 4(*c*) illustrates a side view of FIG. 4(*b*).

FIG. 4(*d*) to FIG. 4(*e*) illustrate schematic diagrams for mounting the ion source baffle in the ion etching machine in other Embodiments of the present disclosure.

Figure 1A:
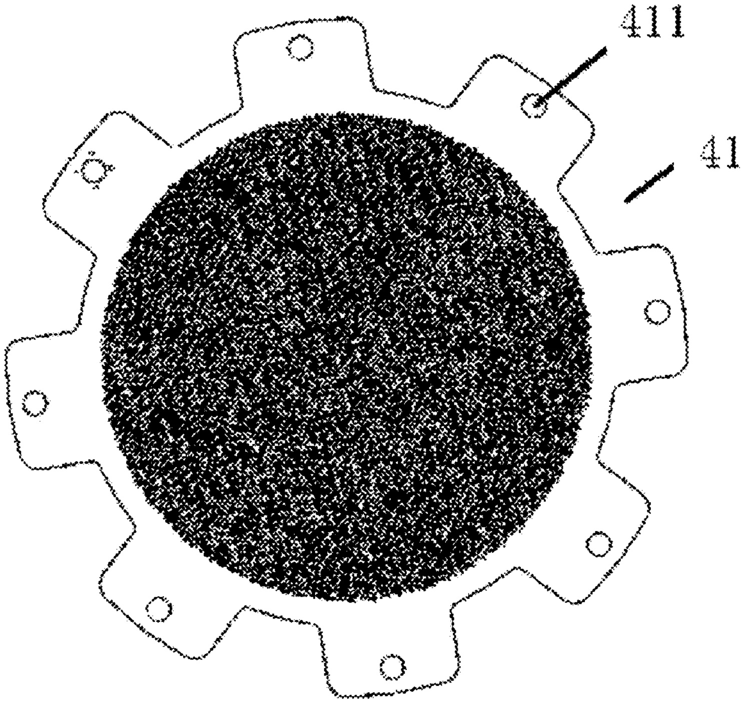
FIG. 1(*a*) illustrates a top view of a screen grid in the prior art.

Wherein, 1. Ion source baffle; 11. Baffle body; 12. Baffle; 2. Discharge chamber; 3. Reaction chamber; 31. Connection cavity; 32. Reaction cavity; 4. Ion source Grid assembly; 41. Screen grid; 42. Accelerating grid; 411. Outer small hole, 5. Target substrate.

DETAILED DESCRIPTION OF THE EMBODIMENTS

The present disclosure will be described in more detail below with reference to the schematic drawings, in which the preferred embodiments of the present disclosure are shown. It should be understood that those skilled in the art would modify the present disclosure described herein, while still achieving the advantageous effects of the present disclosure. Therefore, the following descriptions should be understood as being widely known to those skilled in the art and not as a limitation to the present disclosure.

As illustrated in FIG. 3(*a*), the ion source baffle 1 includes a baffle body 11. The baffle body 11 is of a hollow structure. Baffles 12 are symmetrically and fixedly arranged on an inner wall of the baffle body 11, and the baffles 12 extend towards a center of the baffle body 11. A shielding region formed by baffles 12 gradually decreases in a direction from the inner wall of the baffle body 1 towards the center of the baffle body 11. Preferably, the baffle body 11 is of a ring shape. Baffles 12 can also be of a structure with a larger middle and smaller ends.

In this embodiment, the baffles 12 are horizontally arranged, and the shielding region formed by the baffles 12 refers to a portion shielded by a width region of the baffles 12. The width of the baffles 12 decreases linearly from a peripheral region to a central region, so that plasma shielded by the peripheral region is more than plasma shield by the central region. It would be know to those skilled in the art that the peripheral regions corresponding to three components of the baffle body 11, the baffles 12 and the discharge chamber 2 are the same, and the central regions corresponding to the three components are also the same.

In this embodiment, each of the baffles 12 is of a fan shape. A fan-shaped central angle corresponding to the fan-shaped ranges from 3° to 15° according to an etching speed difference between the peripheral region and the central region. When an etching speed of the peripheral region is slightly higher than that of the central region, the central angle corresponding to the fan shape can be selected as 3 degrees. When the etching speed of the peripheral region is obviously higher than that of the central region, the central angle corresponding to the fan-shaped should be gradually increased to satisfy a requirement for etching uniformity.

Preferably, in order to facilitate processing, thicknesses of the baffle body 11 and each of the baffles 12 should be selected between 3 mm and 6 mm, and an circumference of the baffle body 11 between the adjacent baffles 12 ranges from 8 mm to 15 mm. A material of each of the baffles 12 is a quartz material or a ceramic material.

As illustrated in FIG. 3 (*a*), the quantity of the baffles 12 is six. As illustrated in FIG. 3(*b*), in other embodiments, the quantity of baffles 12 is two.

Figure 1B:
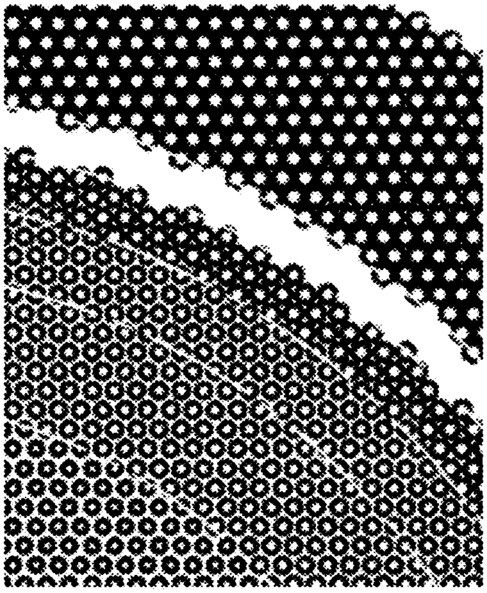
Figure 1C:
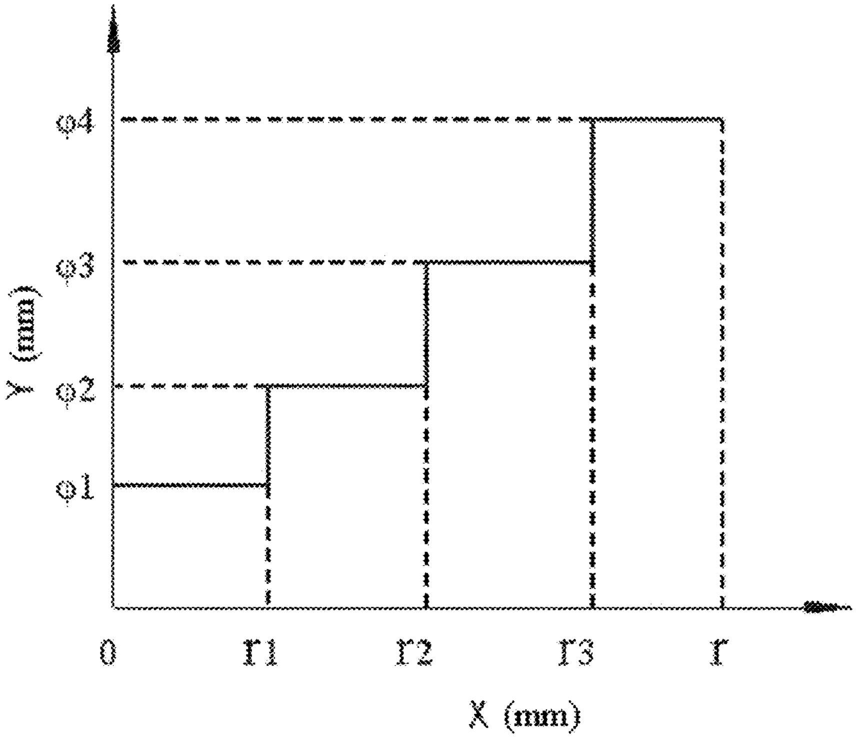
Figure 2A:
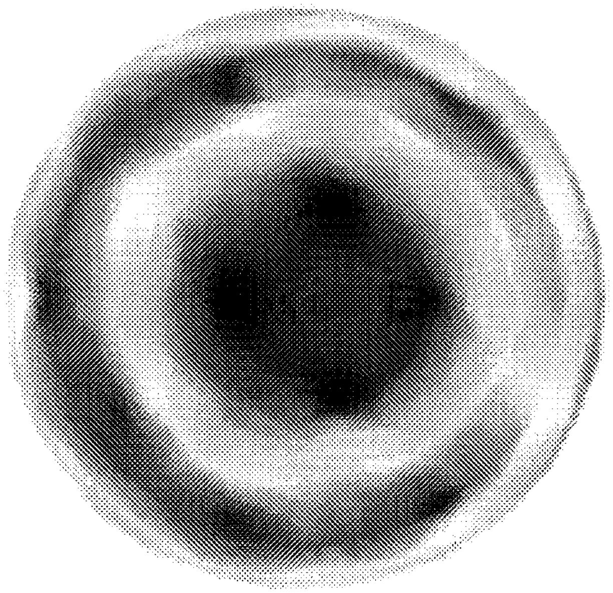
FIGS. 2(*a*) to 2(*b*) illustrate etching rate distribution maps of a target substrate in the prior art.
Figure 2B:
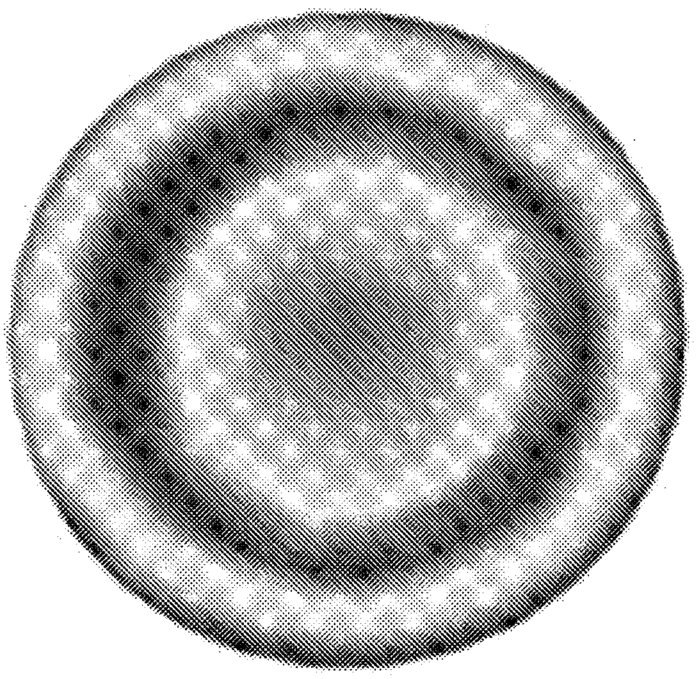
Figure 3A:
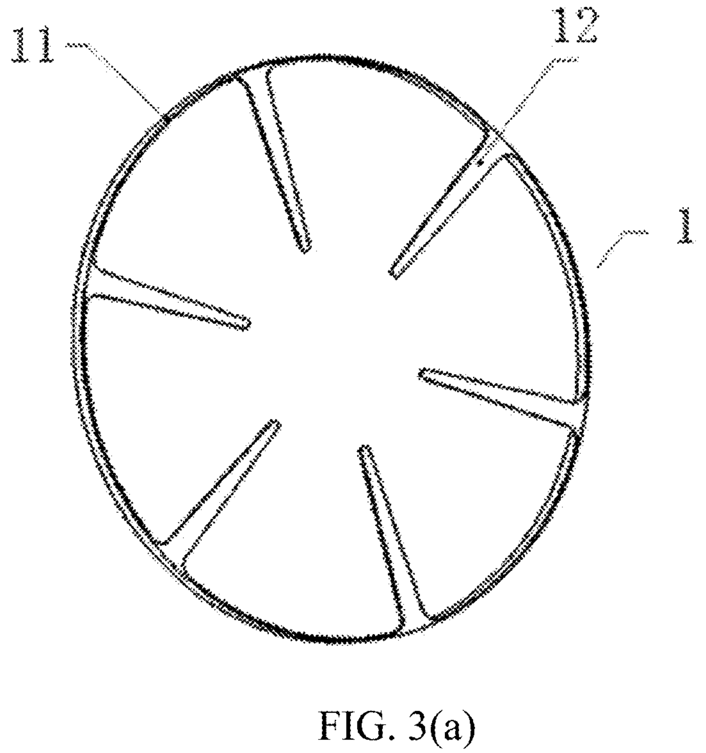
FIG. 3(*a*) illustrates a structural diagram of an ion source baffle in Embodiment 1 of the present disclosure.
Figure 3B:
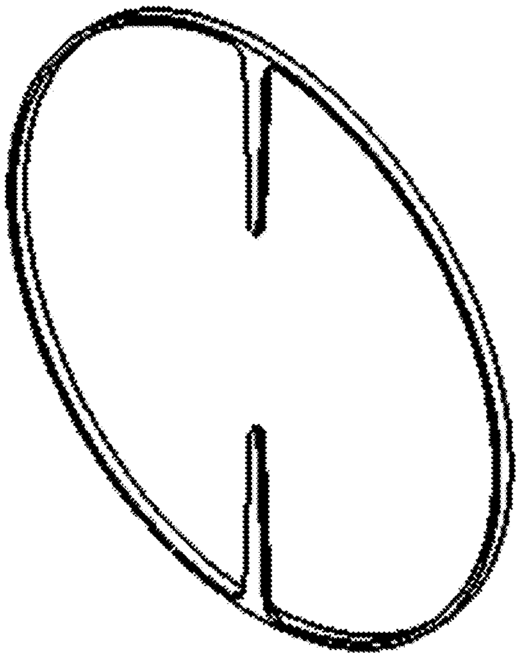
Figure 3C:
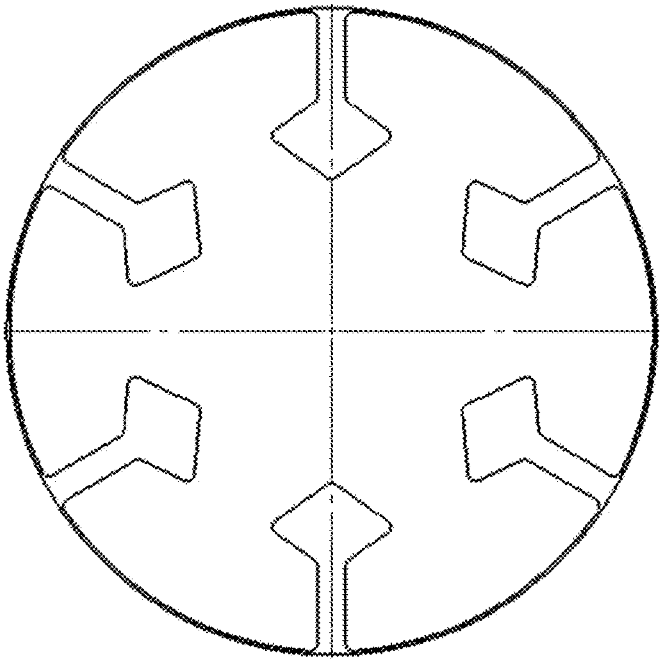
Figure 3D:
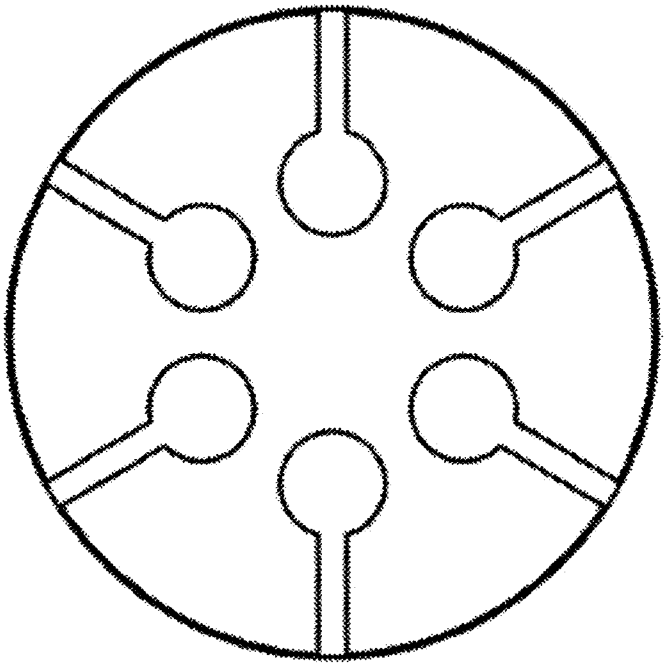
Figure 3E:
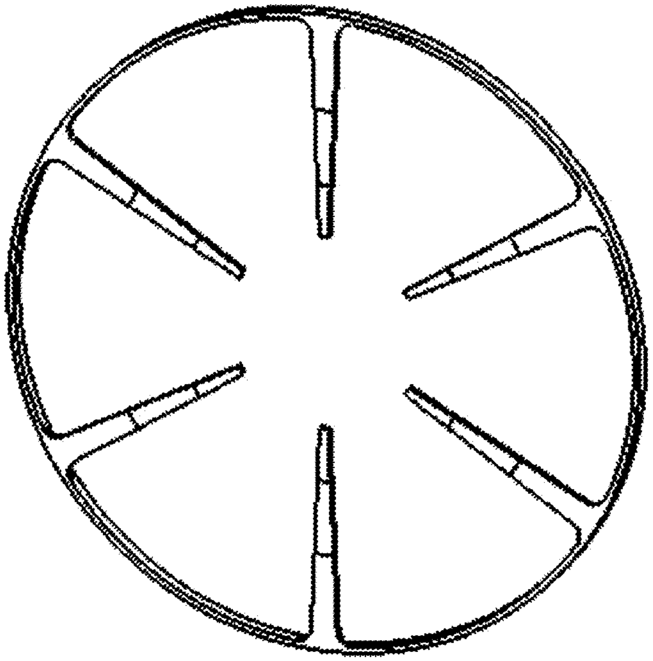
Figure 4A:
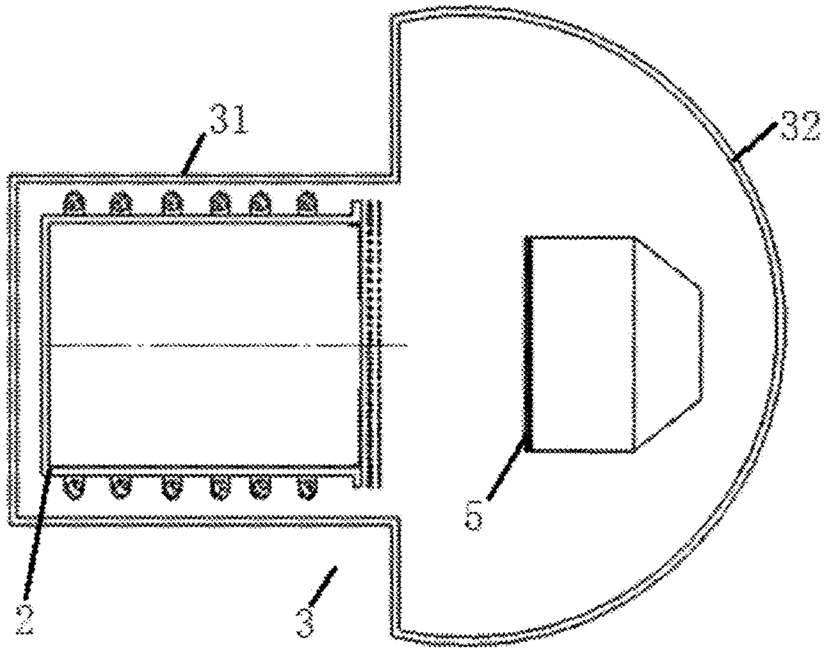
FIG. 4(*a*) illustrates a schematic diagram of an ion etching machine in Embodiment 1 of the present disclosure.
Figure 4B:
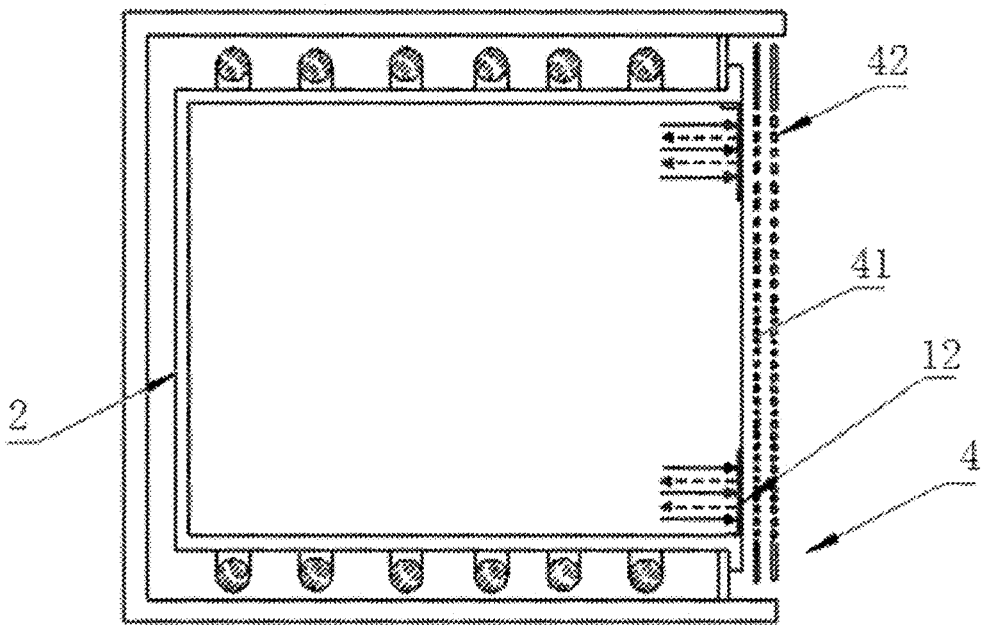
Figure 4C:
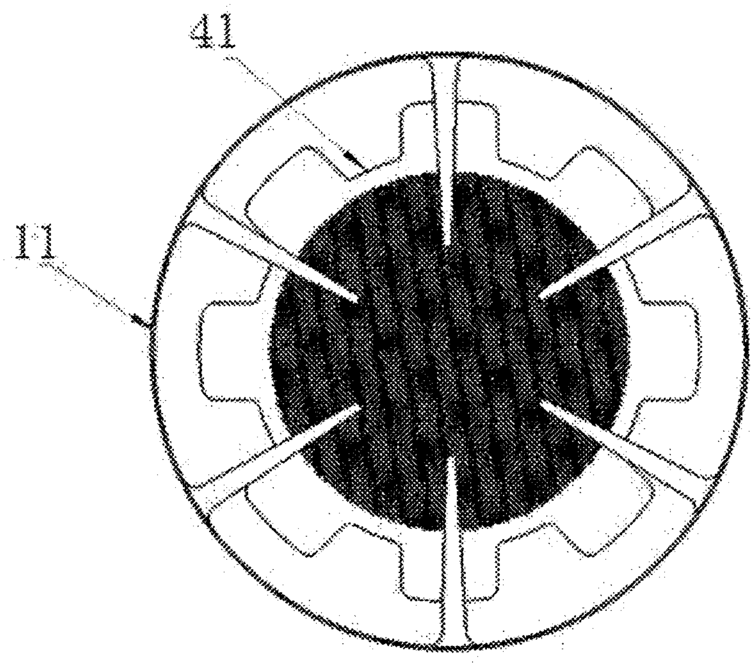
Figure 4D:
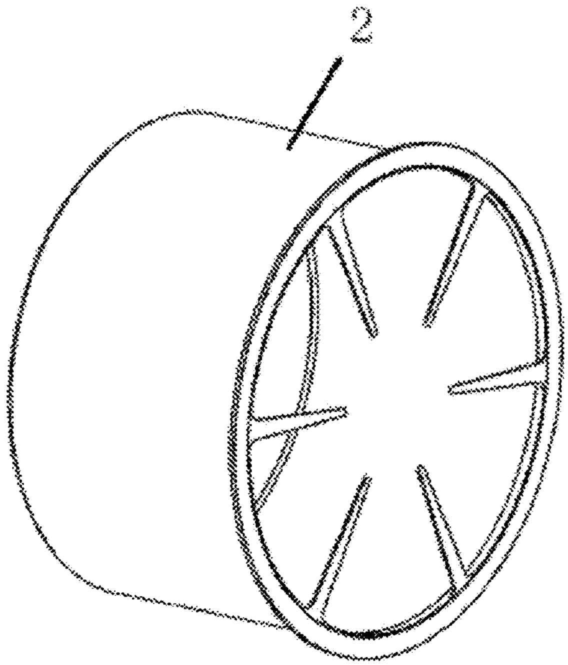
Figure 4E:
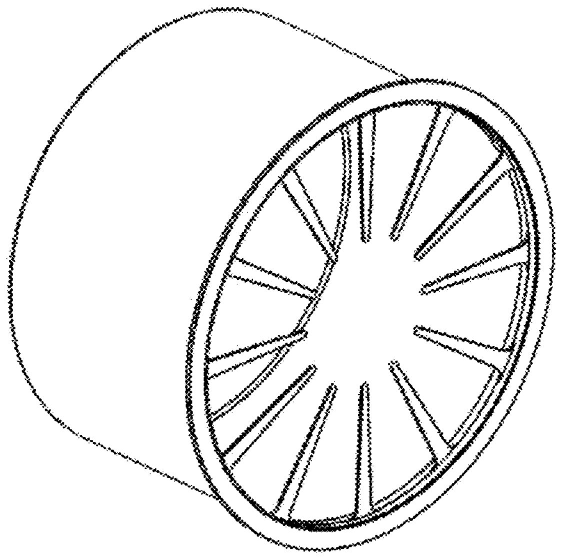

As illustrated in FIG. 3(*c*) to FIG. 3(*d*), in other embodiments, the inner segments of the baffles 12 are of polygonal shapes and circular shapes. In terms of process effects, when a region with a faster etching speed is located between radius r1 and r4, as illustrated in FIG. 1(*b*), a plasma density in the central region needs to be reduced to ensure a uniform plasma distribution during an entire etching process, so that the baffle 12 can be in a shape with a larger middle and a smaller outer ends such as a parallelogram or an ellipse.

A parallelogram is taken as an example, when the etching speed of an etching region between a radius r2 and r3 is significantly higher than that of other regions, the plasma density of the etching region needs to be reduced, so that the baffles 12 should shield more plasma between radius r2 and r3. According to a difference in the etching speeds, a size of the baffle 12 formed by the parallelogram can be changed according to the process testing structure.

This embodiment further provides an ion etching machine. As illustrated in FIG. 4(*a*) to FIG. 4(*c*), based on the above-mentioned ion source baffle 1, an ion source baffle 1 is additionally provided on an existing ion etching machine to form an improved ion etching matching. The improved etching machine mainly includes three parts of a discharge chamber 2, a reaction chamber 3 and an ion source baffle 1. The specific structure is as follow: the reaction chamber 3 includes a connection cavity 31 and a reaction cavity 32 in communication with the connection cavity 31. The discharge chamber 2 is located in the connection cavity 31 and communicated with the reaction cavity 32.

An ion source Grid assembly 4 configured to focus a plasma to form plasma beams is arranged in the connection cavity 31. The ion source Grid assembly 4 is proximate to one side of the discharge chamber 2 in communication with the reaction cavity 32.

The ion source Grid assembly 4 includes a screen grid 41. Inner small holes and outer small holes 411 are arranged on the screen grid 41. An diameter of each of the inner small holes is smaller than that of each of outer small holes. As the prior art, the screen grid 41 in the ion source Grid assembly 4 has the same structure as the screen grid 41 in FIG. 1(*a*).

The ion source baffle 1 is clamped on an inner wall of the discharge chamber 2. The plasma sequentially passes through the ion source baffle 1 and the ion source Grid assembly 4.

In this embodiment, the distance between the ion source baffle 1 and the ion source Grid assembly 4 is greater than zero.

Figure 5:
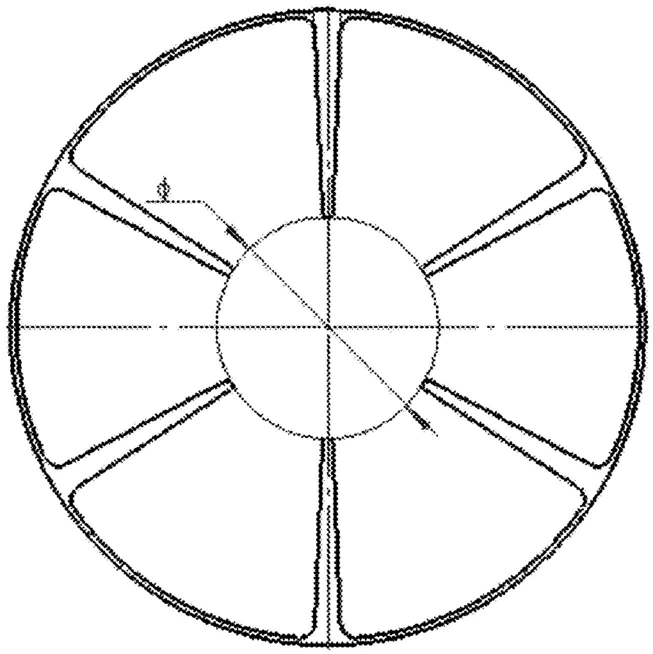
FIG. 5 illustrates a schematic diagram of an inner diameter of the ion source baffle in Embodiment 1 of the present disclosure.

Since aperture sizes of the small holes from a center to a periphery on the screen grid 41 are increased in a piecewise function, as illustrated in FIG. 1(*b*), it is assumed that the change is an N-segment, in the process, as illustrated in FIG. 5, an inner diameter ϕ of the baffle 1 is preferable between R/N and (N−1)*R/N (R is an inner diameter of the discharge chamber 2) according to the peripheral regions with high edge etching speed. When the etching speed of the periphery region is obviously superior to that of other regions, the inner diameter of the fan-shape should be (N−1)*R/N, which prevents the fan-shaped baffle 12 from shielding a larger area and affecting the etching speed in the central region; when the peripheral regions with a higher etching speed are continuously increasing, the inner diameter of the fan-shaped ion source baffle 1 should be reduced continuously to increase the shielding area. The fan-shaped ion source baffle 1 can be in a single-segment type or a multi-segment type, and multiple processing can be avoided by the multi-segment type, and the length of the fan-shaped baffle 12 can be adjusted at any time according to the experimental data, as illustrated in FIG. 3(*e*), in other embodiments, the ion source is in a multi-segment structure.

In order to effectively adjust the plasma density in the peripheral region of the discharge chamber 2 so that the densities of plasma reaching the peripheral region and the central region of target substrate 5 are uniformly distributed, the quantity of the baffles 12 of the ion source baffle 1 can be preferentially selected from 2 to 20, for the ion etching machine with different etching speeds, the quantity of the ion source baffles 1 and the quantity of baffles 12 in each of the ion source baffles 1 are set according to the following working conditions:

(1) When the etching speed in the peripheral region of the target substrate 5 changes less than that in the central region of the target substrate 5, one ion source baffle 1 with only two baffles 12 can be set separately for installation as illustrated in FIG. 3.

(2) As the difference in the etching rate between the periphery region of the target substrate 5 and the central region of the target substrate 5 increases, the quantity of the baffles 12 can be gradually increased up to 6, as illustrated in FIG. 3(*a*) and FIG. 4(*d*).

(3) When the difference in the etching rate between the periphery region of the target substrate 5 and the central region of the target substrate 5 is increasing continuously, the ion source baffle 1 can be assembled in sets. When the etching speed in the periphery region of the target substrate 5 is obviously higher than that in the central region of the target substrate 5, in the case where a single ion source baffle 1 cannot satisfy the requirement, two or more ion source baffles 1 need to be installed so as to ensure the etching uniformity of the target substrate 5, as illustrated in FIG. 4(*e*).

This embodiment further provides a method for using an ion etching machine. Based on the above-mentioned ion etching machine, the method comprises the following steps.

(1) An ion source baffle 1 is clamped on one side of an discharge chamber 2 proximate to an ion source Grid assembly 4.

(2) Plasma is generated in the discharge chamber 2.

(3) After the plasma is shielded by the ion source baffle 1, a quantity of plasma is gradually increased from a peripheral region of the discharge chamber 2 to a central region of the discharge chamber 2.

(4) The plasma is injected into a screen grid 41 of the ion source Grid assembly 4, and then the plasma sequentially passes through the screen 41 to form a plasma beam, and the plasma beam passes through an accelerating grid 42 of the Grid assembly 4 and is injected into the reaction cavity 32.

The foregoing is only the preferred embodiments of the present disclosure, and does not have any limiting effect on the present disclosure. Any form of equivalent substitutions or modifications, made by those skilled in the art to the technical solutions and technical contents disclosed in the present disclosure without departing from the scope of the technical solutions in the present disclosure, still fall within the protection scope of the present disclosure.

What is claimed is:

1. An ion source baffle, comprising: a baffle body, wherein the baffle body is of a hollow structure, baffles are symmetrically and fixedly arranged on an inner wall of the baffle body, the baffles extend towards a center of the baffle body, a shielding area formed by the baffles is reduced in a direction from the inner wall of baffle body towards the center of the baffle body, and a plasma is shielded by the baffle body, wherein each of the baffles is of a fan shape, and a fan-shaped central angle corresponding to the fan shape ranges from 3° to 15°.

2. An ion etching machine based on the ion source baffle according to claim 1, comprising a discharge chamber and a reaction chamber, wherein, the reaction chamber includes a connection cavity and a reaction cavity in communication with the connection cavity;

the discharge chamber is located in the connection cavity and is in communication with the reaction cavity;

an ion source Grid assembly configured to focus a plasma to form a plasma beam is arranged in the connection cavity, the ion source Grid assembly is proximate to one side of discharge chamber in communication with the reaction cavity;

the ion source Grid assembly includes a screen grid, inner small holes and outer small holes are arranged on the screen grid, a diameter of each of the inner small hole is less than a diameter of each the outer small holes; and the ion source baffle is clamped on an inner wall of the discharge chamber, and the plasma sequentially passes through the ion source baffle and the ion source Grid assembly.

3. The ion etching machine according to claim 2, wherein a distance between the ion source baffle and the ion source Grid assembly is greater than zero.

4. A method for using an ion etching machine based on the ion etching machine according to claim 2, comprising the following steps:

(1) clamping the ion source baffle on one side of the discharge chamber proximate to the ion source Grid assembly;

(2) generating the plasma in the discharge chamber;

(3) gradually increasing, after the plasma is shielded by the ion source baffle, a quantity of the plasma from a peripheral region of the discharge chamber to a central region of the discharge chamber; and (4) injecting the plasma into a screen grid of the ion source Grid assembly, then the plasma sequentially passing through the screen grid to form a plasma beam, and the plasma beam passing through an accelerating grid of a Grid assembly and being injected into the reaction cavity.

* * * * *